United States Patent [19]

Schlosser

[11] Patent Number: 5,041,360

[45] Date of Patent: Aug. 20, 1991

[54] PROCESS FOR PRODUCING AN OZONE-RESISTANT FLEXOGRAPHIC PRINTING FORM

[75] Inventor: Hans-Joachim Schlosser, Wiesbaden, Fed. Rep. of Germany

[73] Assignee: Hoechst Aktiengesellschaft, Frankfurt am Main, Fed. Rep. of Germany

[21] Appl. No.: 449,773

[22] Filed: Dec. 13, 1989

[30] Foreign Application Priority Data

Dec. 13, 1988 [DE] Fed. Rep. of Germany ....... 3841854

[51] Int. Cl.$^5$ ............................................. G03F 7/40
[52] U.S. Cl. .................................... 430/309; 430/306; 430/331
[58] Field of Search ............... 430/331, 912, 918, 306, 430/309, 331, 912, 918

[56] References Cited

U.S. PATENT DOCUMENTS

| | | | |
|---|---|---|---|
| 4,162,919 | 7/1979 | Richter et al. | 96/87 |
| 4,320,188 | 3/1982 | Heinz et al. | 430/281 |
| 4,423,135 | 12/1983 | Chen et al. | 430/271 |
| 4,547,455 | 10/1985 | Hiramoto et al. | 430/325 |
| 4,680,251 | 7/1987 | Schober | 430/306 |
| 4,963,472 | 10/1990 | Schlosser et al. | 430/303 |

FOREIGN PATENT DOCUMENTS

| | | |
|---|---|---|
| 0160468 | 11/1985 | European Pat. Off. |
| 1358062 | 6/1974 | United Kingdom |
| 1395822 | 5/1975 | United Kingdom |
| 1577706 | 10/1980 | United Kingdom |

*Primary Examiner*—Charles L. Bowers, Jr.
*Assistant Examiner*—Janis L. Dote
*Attorney, Agent, or Firm*—Foley & Lardner

[57] ABSTRACT

A process for producing an ozone-resistant flexographic printing form based on a photopolymerizable elastomeric mixture is described, which comprises applying to a developed and optionally post-treated flexographic printing form a treatment reagent containing as the essential constituent at least one polyglycol ether of the general formula I

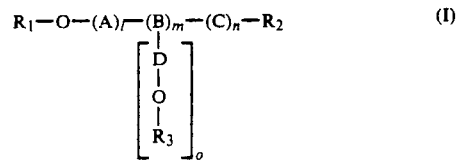

in which
$R_1$ and $R_2$ are alkyl, especially ($C_1$–$C_3$)-alkyl,
$R_3$ is hydrogen or alkyl, especially ($C_1$–$C_3$)-alkyl,
A, B, C can be identical or different and are
and D oxa-n- or -iso-alkylene, especially oxa-n- or -iso-($C_1$–$C_5$)-alkylene and
$1+m+n+o$ is 3 to 40.

22 Claims, No Drawings

PROCESS FOR PRODUCING AN OZONE-RESISTANT FLEXOGRAPHIC PRINTING FORM

BACKGROUND OF THE INVENTION

The present invention relates to a process for producing an ozone-resistant flexographic printing form based on a photopolymerizable elastomeric mixture.

Elastomers, in particular those based on butadiene or isoprene, have been known for a long time for producing flexographic printing forms and are described, for example, in DE-B 2,215,090 (=US-A 4,423,135), DE-A 2,138,582 (=GB-A 1,358,062), 2,223,808 (=GB-A 1,395,822), DE-B 2,815,678 (=GB-A 1,577,706), DE-A 2,456,439 (=US-A 4,162,919) 15 2,942,183 (=US-A 4,320,188). It was found, however, that flexographic printing forms containing these elastomers become brittle with even the slightest presence of ozone and show cracks.

Ozone, which represents a risk to these plates, is formed both during the imagewise exposure of the photopolymerizable elastomeric layer, especially if UV light is used, and during the use of the exposed and developed printing forms. In the latter case, particularly high ozone concentrations arise, especially when flexible packaging materials such as paper or plastics are to be printed. This is because in order to ensure sufficiently strong adhesion of the printing ink, for example, to the plastic films, the latter are corona-treated before printing. Since considerable quantities of ozone are formed during the corona treatment and the treatment is most efficient when it takes place immediately before the printing step, the printing form is contacted to a considerable extent with ozone formed during this process. The susceptibility of the developed printing form to ozone is further increased by the fact that a post-treatment of the printing forms with halogen, in particular with bromine, is carried out in most cases, which is necessary in order to reduce tackiness.

To improve the resistance of the printing form to the ozone which forms cracks and promotes brittleness, various approaches have been followed.

DE-A 2,215,090 discloses improved ozone resistance through additions to the photopolymerizable mixture. Microcrystalline wax and paraffin wax, dibutylthiourea, 1,1,3,3-tetramethylthiourea, norbornene, N-phenyl-2-naphthylamine, unsaturated vegetable oils, ethylene/vinyl acetate copolymers, polyurethanes, chlorinated and/or chlorosulfonated polyethylenes, chlorinated ethylene/methacrylic acid copolymers, polypentadienes, furfural-derived resins, ethylene/propylidene rubbers, diethylene glycol esters of resins and copolymers of α-methylstyrene with vinyltoluene are proposed as additives.

The disadvantage of this method is that the additives are frequently inadequate to ensure the required resistance to ozone or, if the effective concentration of these additives is increased, the photopolymerizable mixture shows such cloudiness that satisfactory imaging is no longer feasible.

Another method for protecting a flexographic printing form from ozone is described in DE-A 3,512,632 (=US-A 4,680,251). This method is not based on any additions to the photopolymerizable mixture, but describes a post-treatment of the printing form, which has been developed and treated with halogen, with certain polyglycol compounds. The polyglycol compounds described are either not etherified or only mono-etherified. However, flexographic printing forms which had been treated with these polyglycol compounds developed cracks after only a short time in ozone-containing air.

SUMMARY OF THE INVENTION

It is therefore an object of the present invention to provide a process for the treatment of flexographic printing forms based on a photopolymerizable elastomeric mixture, which process ensures an adequately high ozone resistance.

In accordance with these and other objects of the invention a process is provided for producing an ozone-resistant flexographic printing form based on a photopolymerizable elastomeric mixture, comprising the steps of developing a flexographic printing form; and applying to the developed plate a treatment reagent comprising at least one polyglycol ether of the formula I

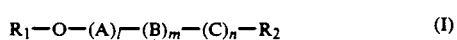
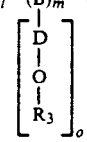

(I)

in which
$R_1$ and $R_2$ are alkyl, especially (C:-C3)-alkyl,
$R_3$ is hydrogen or alkyl, especially ($C_1$-$C_3$)-alkyl,
A, B, C can be identical or different and are
and D oxa-n- or -iso-alkylene, especially oxan- or -iso-($C_1$-$C_5$)-alkylene, and
$1+m+n+o$ is 3 to 40.

Other objects, features and advantages of the present invention will become apparent from the following detailed description. It should be understood, however, that the detailed description and the specific examples, while indicating preferred embodiments of the invention, are given by way of illustration only., since various changes and modifications within the spirit and scope of the invention will become apparent to those skilled in the art from this detailed description.

DETAILED DESCRIPTION OF THE PREFERRED EMBODIMENTS

According to the present invention, a treatment reagent is applied to a flexographic printing form, which has been developed and, if appropriate, post-treated in the usual manner. The treatment reagent contains, as its essential constituent, at least one polyglycol ether of the general formula I

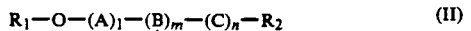
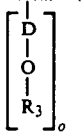

(II)

in which
$R_1$ and $R_2$ alkyl, especially ($C_1$-$C_3$)-alkyl,
$R_3$ is hydrogen or alkyl, especially ($C_1$-$C_3$)-alkyl,
A, B, C can be identical or different and are and D oxa-n- or -iso-alkylene especially oxan- or -iso-($C_1$-$C_5$)-alkylene and $l+m+n+o$ is 3 to 40.

It is preferred when m and o are greater than 0 and o is less than or equal to m, and $R_3$ is ($C_1$-$C_3$)-alkyl. In particular, o and m are equal to 1.

If o is not 0, D is preferably identical to A or C, and B is in this case an oxa-n-alkylene radical, especially an oxa-n-($C_3$ or $C_5$)-alkylene radical.

It is particularly preferred, however, when o=0 and the sum of l, m and n gives 3–40.

In a further preferred embodiment, A is identical to C, but different from B. In this case, it is preferred that A and C are an oxa-n-($C_2$–$C_4$)-alkylene radical and B is an oxa-n- or -iso-($C_2$ or $C_3$)-alkylene radical. An oxa-isoalkylene radical is especially preferred for B.

It is also preferred when m is 0 in addition to o being 0, and the sum of l and n reaches 3–40. In this case, A and C are oxa-n- or -iso-($C_1$-$C_5$)-alkylene, in particular oxa-n- or -iso-($C_2$ or $C_3$)-alkylene, A or C differing at least to the extent that they are not both an oxa-n-alkylene radical or an oxa-isoalkylene radical.

Rather, however, that variant is preferred in which l and m or m and n are each equal to 0. In this case, C and A are oxa-n- or -iso-($C_2$-$C_5$)-alkylene, especially oxa-n- or -iso-($C_2$ or $C_3$)-alkylene.

$R_1$ and $R_2$ are in all cases ($C_1$-$C_3$)-alkyl. In particular, $R_1$ and $R_2$ are identical and particularly preferably are methyl.

The mean molecular weight of the polyglycol ether according to the general formula I is 100 to 1,400, especially 200 to 1,200 and particularly preferably 200 to 600.

In a special embodiment, the treatment reagent according to the invention contains only one polyglycol ether of the general formula I.

It was particularly surprising that a cost-treatment with the polyglycol dialkyl ether described leads to such a high ozone resistance, since the use of the corresponding monoalkyl ethers do not provide ozone resistance and therefore would lead away from the testing of dialkyl ethers.

The treatment solution of the process according to the invention contains at least about 50% by weight, preferably at least about 80% by weight, and with particular preference exclusively compounds according to general formula I. It is particularly preferred if the treatment solution contains only one compound of the general formula I.

If the treatment solution is not exclusively composed of compounds of the general formula I, it can also contain, as a mixture, treatment reagents of the state of the art, such as, for example, polyglycol ethers of DE-A-3,512,632, and also solvents such as halogenated hydrocarbons, alcohols, aromatic hydrocarbons, terpenes, esters and phenol ethers. However, this embodiment is not preferred.

According to the process of the invention, the treatment solution described is applied after development of the recording material and, if appropriate, after a treatment of the resulting flexographic printing form with halogen, especially with bromine. The application can be carried out either by dabbing on, for example using a cotton wool dabber, brush or sponge, or by immersing the flexographic printing form into a bath containing the treatment solution. The excess treatment solution is then removed, for example, by allowing it to run off, or by means of a dabber. Optionally, the flexographic printing form treated in the manner according to the invention can then be heated, for example, in order to modify the concentration of the treatment solution on the flexographic printing form.

The flexographic printing forms, treated in the process according to the invention with the treatment solution described, contain, as the elastomeric binder, predominantly polymers of conjugated aliphatic dienes having 4 to 5 carbon atoms. Suitable binders include natural rubbers, homopolymers or copolymers of butadiene and isoprene, copolymers of butadiene and/or isoprene with other monomers such as styrene, vinyltoluene, acrylonitrile or (meth)acrylic acid esters, for example nitrile rubbers, random copolymers of styrene/butadiene, styrene/isoprene and styrene/isoprene/butadiene, or also block copolymers of styrene monomers and butadiene and/or isoprene, having a styrene content of about 10 to 50% by weight. Elastomeric binders of this type are described in DE-A-2,215,040.

The photopolymerizable mixture according to the invention contains in general about 20 to 98% by weight, preferably about 30 to 95% by weight, of at least one of the elastomeric binder types. It also contains at least one olefinically unsaturated compound polymerizable by free radicals, and at least one photoinitiator.

Suitable monomers having one or more polymerizable olefinic double bonds are especially esters and amides of acrylic and methacrylic acid. Examples are the compatible monoacrylates and diacrylates and monomethacrylates and dimethacrylates of monohydric or polyhydric alcohols such as ethylene glycol, di-, tri-, tetra- or polyethylene glycols, the latter preferably with 10 to 15 ethylene glycol units, 1,3-propanediol, 1,6-hexanediol, dodecanediol, glycerol, 1,1,1-trimethylolpropane, 1,2,4-butanetriol or pentaerythritol, for example, ethylene glycol monomethacrylate, 1,3-propanediol monomethacrylate, glycerol monoacrylate and diacrylate, hexanediol diacrylate, hexanediol dimethacrylate, 2-ethylhexyl acrylate, lauryl methacrylate, stearyl methacrylate, 1,2,4-butanetriol monomethacrylate, pentaerythritol triacrylate, polyethylene glycol methyl etheracrylate, tetradecaethylene glycol dimethacrylate or the triether of glycerol and 3 mol of N-methylolacrylamide or N-methylolmethacrylamide. Alkenylphosphonic and alkenylphosphinic acid esters according to German Patent Application P 3,817,424.3 can also be used. The quantity of monomers is in general about 1 to 70% by weight, preferably about 2 to 50% by weight, of the nonvolatile constituents of the mixture.

The photoinitiators used in the photopolymerizable mixture are compounds which have an adequate thermal stability during the processing of the recording materials and show adequate formation of free radicals during exposure with initiation of the polymerization of the monomers. They should absorb light in the wavelength region from about 250 to about 500 nm with the formation of free radicals. Examples of suitable photoinitiators are acyloins and derivatives thereof, such as benzoin, benzoin alkyl ethers, for example, benzoin isopropyl ether, vicinal diketones and derivatives thereof, for example, benzil, benzil acetals such as benzil dimethyl ketal, fluorenones, thioxanthones, polynuclear quinones, acridines and quinoxalines; and also trichloromethyl-s-triazines, 2-halogenomethyl-4-vinyl-1,3,4-oxadiazole derivatives, halogeno-oxazoles substituted by trichloromethyl groups, carbonylmethylene heterocyclic compounds containing trihalogenomethyl groups according to DE-A 3,333,450, acylphosphine oxide compounds such as are described, for example, in DE-A 3,133,419, and other phosphorus-containing photoinitiators, for example, the 6-acyl-(6H)-dibenzo[c,e][1,2]oxaphosphorine 6-oxides described in German Patent Application P 3,827,735.2, especially 6-(2,4,6-trimethylbenzoyl)-(6H)-dibenzo [c,e][1,2]oxaphosphorine-6-oxide. The photoinitiators can also be used in combination with one another or with coinitiators or activators, for example, with Michler's ketone and derivatives thereof or 2-alkyl-anthraquinones. The quantity of photoinitiator is in general about 0.01 to 10% by weight, preferably about 0.5 to 5% by weight, of the recording material.

It is frequently of advantage also to add further auxiliaries and additives to the recording material, for example, inhibitors of thermal polymerization such as hydroquinone and its derivatives, 2,6-di-tert.-butyl-p-cresol, nitrophenols, nitrosamines such as N-nitrosodiphenylamine or salts of N-nitrosocyclohexylhydroxylamine, for example alkali metal salts or aluminum salts thereof. Further conventional additives are dyes, pigments, plasticizers, antihalation agents, antioxidants, crosslinking agents, regulators, fillers, flow agents and further auxiliaries to improve the function of the layer.

The photopolymerizable mixture can be used for producing relief and flexographic printing plates by casting from a solution in an organic solvent and by kneading at elevated temperatures and subsequent pressing. Production is also possible by extruding in a single-screw or twin-screw extruder with subsequent final forming by means of a polishing stack or calender to give layers of a thickness from about 0.02 to 10 mm, preferably from about 0.4 to 6 mm. Production by the roller head process is likewise possible. The layer can be laminated to the surface of the suitable carrier, or a solution of the mixtures according to the invention can be applied to a layer carrier.

In addition to the production of flexographic printing forms, the photopolymerizable mixture can also be used, for example, for the production of planographic printing plates, gravure printing cylinders, screen printing stencils and photoresists.

Depending on the intended use, examples of suitable carriers are polyester films, steel sheets or aluminum sheets, copper cylinders, screen printing stencil carriers, plies of foam material, rubber-elastic carriers or printed circuit boards. It can also be advantageous to apply to the lightsensitive recording layer a covering layer or protective layer, for example, a thin layer of polyvinyl alcohol, or a covering film which can be peeled off, for example, of a polyethylene terephthalate or polyamide. Moreover, precoating of the carrier can be advantageous. The additional layer between the carrier and the light-sensitive layer can, for example, be effective as an antihalation layer or as an adhesion layer.

The recording material formed by the carrier and the photopolymerizable layer is exposed imagewise with actinic light from light sources such as mercury vapor lamps or fluorescent tubes, the emitted wavelength preferably being between about 300 and 420 nm.

Removal of the unexposed and uncrosslinked layer areas can be effected by spraying, washing or brushing with chlorinated hydrocarbons, esters, aromatic compounds or phenol ethers, such as are described in DE-A 2,215,090 and in German Patent Applications, P 3,836,402.6, P 3,836,403.4 and P 3,836,404.2 which are not prior publications. Minor amounts of antifoam or water-miscible organic solvents, for example, lower aliphatic alcohols, can also be added to the solution. Depending on the binder used, development is also possible with water or aqueous solutions. Expediently, the developed relief forms are dried at up to 120 C and, if appropriate, post-exposed simultaneously or subsequently with actinic light. After the flexographic printing form is dried, it can be post-treated with a halogen-containing solution such as, for example, a solution of bromine or chlorine. A post-treatment with actinic radiation, especially of a wavelength of less than about 300 nm, is likewise possible. Before the imagewise exposure, the whole area can be briefly exposed likewise with actinic light from the opposite side.

The recording material is particularly suitable for producing printing forms, above all letterpress printing forms or relief printing forms, which are particularly suitable for flexographic printing.

The invention is explained by the examples which follow. In the examples, p.b.w. means parts by weight; unless otherwise stated, g:cm3 are related as 1:1.

Example 1 (Comparison example)

A photopolymerizable elastomeric mixture composed of 90 parts by weight of a styrene/isoprene/ styrene three-block copolymer having a styrene content of 30% by weight, 8 parts by weight of hexanediol diacrylate, 2 parts by weight of benzil dimethyl ketal and 0.3 part by weight of 2,6-di-tert.-butyl-4-methylphenol in 20 parts by weight of a medicinal white oil (refractive index = 1.479 according to DIN 51423 part I) and 100 parts by weight of toluene was prepared.

The mixture was cast to give a 6 mm thick layer on a 125 $\mu$m thick, biaxially stretched and heat-set polyester film in a metal frame. After evaporation of the toluene, a 125 $\mu$m thick, biaxially stretched and heat-set polyester film, provided with an adhesion layer, was applied to the free surface of the now 3 mm thick solid photopolymer layer, and the resulting three-layer element was pressed for 5 minutes under a pressure of 400 N/cm$^2$ at 110° C. in a plate press, using 2.7 mm thick spacers.

After the polyester film which had not been treated with an adhesion promoter had been peeled off, an overcoat of polyamide in a thickness of 3-4 $\mu$m was laminated on in its place. At first, the whole area of the photopolymer layer was exposed through the remaining polyester film. For this purpose, the multi-layer element was exposed for 10 seconds to the radiation of a commercially available UV-A flat exposure apparatus (spectral region 320–400 nm, radiation intensity on the photopolymer surface: 14 mW/cm$^2$) Imagewise exposure was then carried out with the same radiation source for 30 minutes, but from the other side of the multi-layer element.

Development was carried out with perchloroethylene. After the resulting flexographic printing form had been dried, it was post-treated for 5 minutes with a 0.4% by weight aqueous solution of bromine, followed by washing with water for 10 minutes.

The flexographic printing form was then post-exposed for 10 minutes in a commercially available UV-A flat exposure apparatus.

The flexographic printing form was then clamped to a cylinder of 7 cm diameter and subjected at room temperature to ozone-containing air (0.5 ppm of ozone) in a chamber. The plate was assessed, on the one hand, for the time at which the first cracks appear (cracks visible without magnification) and, on the other hand, for the number of cracks which had formed after ozone treatment for 20 hours at room temperature. The first cracks appeared as early as after 3 hours. The results are summarized in Table 1.

Example 2 (Comparison example)

A flexographic printing form corresponding to Example 1 was prepared. The printing form, post-treated with bromine, was then immersed for 20 seconds into tripropylene glycol monomethyl ether and the excess liquid was subsequently dabbed off. The first cracks in the printing form appeared as early as after 2.5 hours of ozone treatment (0.5 ppm). The results can be seen from Table 1.

Example 3 (Comparison example)

A flexographic printing form corresponding to Example 1 was prepared. The printing form, post-treated with bromine, was then immersed for 20 seconds into polypropylene glycol 1,200 and the excess liquid was subsequently dabbed off. The first cracks appeared as early as after 2 hours in the ozone chamber (0.5 ppm of ozone). The results are summarized in Table 1.

Example 4

A flexographic printing plate was prepared according to Example The printing form, post-treated with bromine, was then immersed for 20 seconds into triethylene glycol dimethyl ether and the excess liquid was subsequently dabbed off. A crack did not appear until after 12.5 hours in the ozone chamber. Table 1 shows the results.

Example 5

A flexographic printing plate was prepared corresponding to Example 1 and post-treated with bromine. The printing form was then immersed for 20 seconds into polyethylene glycol dimethyl ether 250. After the liquid had been dabbed off, the plate was exposed to air having an ozone content of 0.5 ppm. No cracks were detectable even after treatment for 20 hours.

Example 6

A flexographic printing plate was prepared corresponding to Example 1 and cost-treated with bromine. The printing form was then immersed for 20 seconds into polyethylene glycol dimethyl ether 500. After the excess liquid had been dabbed off, the plate was exposed to air having an ozone content of 0.5 ppm. The first cracks were not observable until after a treatment time of 12.5 hours.

Table 1

Exposure of the flexographic printing forms treated according to the invention to ozone-containing air (0.5 ppm of ozone)

| Example | Start of crack formation after: | Crack frequency after 20 hours (number of cracks) |
| --- | --- | --- |
| 1 | 3 hours | some |
| 2 | 2.5 hours | some |
| 3 | 2 hours | some |
| 4 | 12.5 hours | one |
| 5 | over 20 hours | none |
| 6 | 12.5 hours | few |

Table 1 demonstrates that he flexographic printing forms post-treated according to the invention are, in a surprising manner, more resistant to ozone-containing air than flexographic printing forms which have hitherto been known to those skilled in the art.

What is claimed is:

1. A process for producing an ozone-resistant flexographic printing form based on a photopolymerizable elastomeric mixture, comprising the steps of:
    imagewise exposing a flexographic printing form;
    developing the flexographic printing form; and applying to the developed plate a treatment reagent comprising at least one polyglycol ether of the formula I

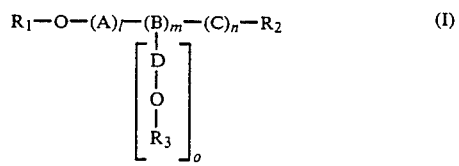

in which
  $R_1$ and $R_2$ are alkyl, especially $(C_1-C_3)$-alkyl,
  $R_3$ is hydrogen or alkyl, especially $(C_1-C_3)$-alkyl,
  A, B, C can be identical or different and are
  and D oxa-n- or -iso-alkylene, and
  $l+m+n+o$ is 3 to 40.

2. The process as claimed in claim 1, wherein, in the treatment reagent of the formula I,
  m and o are greater than 0,
  o is less than or equal to m,
  D is A or C,
  B is oxa-n-alkylene, and
  $R_1$, $R_2$
  and $R_3$ are $(C_1-C_3)$-alkyl.

3. The process as claimed in claim 1, wherein, in the treatment reagent of the formula I, m=0 and o=0, the sum of l and n is between 3 and 40 and
  A and C are oxa-n- or -iso-$(C_1-C_5)$-alkylene, and
  $R_1$ and $R_2$ are $(C_1-C_3)$-alkyl.

4. The process as claimed in claim 1, wherein, in the treatment reagent of the formula I,
  $R_1$ and $R_2$ are $(C_1-C_3)$-alkyl, and for l and m equal to 0,
  C is oxo-n- or -iso-$(C_2-C_5)$-alkylene, and, for m and n equal to 0,
  A is oxa-n- or -iso-$(C_2-C_5)$-alkylene.

5. The process as claimed in claim wherein the treatment reagent of the formula I has a mean molecular weight of 100 to 1,400.

6. The process as claimed in claim 1, wherein the polymerizable elastomeric mixture consists essentially of an elastomeric binder, an olefinically unsaturated compound polymerizable by free radicals, and a photoinitiator.

7. The process as claimed in claim 1, wherein the treatment solution comprises at least 50% by weight, of especially a polyglycol ether of the formula I.

8. The process as claimed in claim 1, wherein the flexographic printing form consists essentially of a carrier and a layer of a photopolymerizable elastomeric mixture as claimed in claim 6.

9. The process as claimed in claim 1, additionally comprising the steps of imagewise exposing the form with actinic light before said developing step, drying the developed layer, and post-exposing the dried layer with actinic light.

10. The process as claimed in claim 9, wherein, before the imagewise exposure, the whole area of the photopolymerizable elastomeric layer is briefly exposed with actinic light from the opposite side.

11. The process as claimed in claim 1, wherein, after development, the layer is post-treated with halogen or post-exposed with actinic light.

12. The process as claimed in claim 1, wherein the application of the treatment reagent to the developed flexographic printing form is effected by dabbing the reagent on the form or by immersing the form in a bath containing the treatment reagent.

13. The process as claimed in claim 5, wherein the treatment reagent of the formula I has a mean molecular weight of 200 to 1,200.

14. The process as claimed in claim 7, wherein the treatment solution comprises
at least 80% by weight of especially a polyglycol ether of the formula I.

15. The process as claimed in claim 11, wherein, the layer is post-treated with bromine.

16. The process as claimed in claim 4, wherein $R_1$ and $R_2$ are methyl.

17. The process as claimed in claim 1, wherein the treatment reagent consists essentially of only one compound according to formula I.

18. The process as claimed in claim 1, wherein A, B, C and D are oxa-n- or -iso-$(C_1-C_5)$-alkylene.

19. The process as claimed in claim 2, wherein B is oxa-n-$(C_3$ or $C_5)$-alkylene.

20. The process as claimed in claim 3, wherein A and C are oxa-n- or -iso-$(C_2$ or $C_3)$alkylene.

21. The process as claimed in claim 4, wherein for l and m equal to 0, C oxa-n- or -iso-$(C_2$ or $C_3)$-alkylene, and for m and n equal to 0, A is oxa-n- or -iso-$(C_2$ or $C_3)$-alkylene.

22. An ozone-resistant flexographic printing form produced by the process defined in claim 1.

* * * * *